United States Patent
Wang

(10) Patent No.: US 7,392,503 B2
(45) Date of Patent: Jun. 24, 2008

(54) METHOD OF CORRECTING MASK PATTERN

(75) Inventor: Li-Ming Wang, Taoyuan (TW)

(73) Assignee: Winbond Electronics Corp., Hsinchu (TW)

( * ) Notice: Subject to any disclaimer, the term of this patent is extended or adjusted under 35 U.S.C. 154(b) by 97 days.

(21) Appl. No.: 11/161,023

(22) Filed: Jul. 20, 2005

(65) Prior Publication Data

US 2007/0022401 A1    Jan. 25, 2007

(51) Int. Cl.
*G06F 17/50* (2006.01)

(52) U.S. Cl. .......................... 716/21; 716/19

(58) Field of Classification Search ............. 716/19–21; 430/5, 22, 30
See application file for complete search history.

(56) References Cited

U.S. PATENT DOCUMENTS

| | | | | |
|---|---|---|---|---|
| 6,081,658 A * | 6/2000 | Rieger et al. | ................. | 716/21 |
| 6,444,373 B1 * | 9/2002 | Subramanian et al. | ......... | 430/5 |
| 6,579,651 B2 * | 6/2003 | Subramanian et al. | ......... | 430/5 |
| 6,792,592 B2 * | 9/2004 | Keogan et al. | ................ | 716/19 |
| 6,925,202 B2 * | 8/2005 | Karklin et al. | .............. | 382/145 |
| 7,124,395 B2 * | 10/2006 | Shi et al. | ...................... | 716/19 |
| 2004/0015808 A1 * | 1/2004 | Pang et al. | .................... | 716/19 |
| 2005/0196688 A1 * | 9/2005 | Kim et al. | ...................... | 430/5 |

* cited by examiner

*Primary Examiner*—Jack Chiang
*Assistant Examiner*—Binh C Tat
(74) *Attorney, Agent, or Firm*—Jianq Chyun IP Office

(57) ABSTRACT

A method of correcting a mask pattern is provided. First, an original writer drawing data of a circuit layout pattern is inputted. Then, according to the original writer drawing data, a correcting writer rule is selected by searching from a look-up table. According to the correcting writer rule, the original writer drawing data is corrected to obtain a corrected writer drawing data of the circuit layout pattern.

4 Claims, 4 Drawing Sheets

METHOD OF CORRECTING MASK PATTERN

BACKGROUND OF THE INVENTION

1. Field of the Invention

The present invention relates to a photolithographic apparatus and operating method thereof, and more particularly, to a method of correcting mask pattern and correcting apparatus thereof.

2. Description of the Related Art

In recent years, the trend in the development of semiconductor is miniaturization of circuit devices. Among the processes used in semiconductor production, photolithographic process plays a very important role. Critical dimensions (CD) concerning semiconductor device structures, such as patterning various thin films, are dependent on the photolithographic process, which also determine the development of photolithographic technology. Thus, the accuracy of a photomask pattern is very crucial. If the pattern on the photomask is inaccurate, an inaccurate pattern will be transferred. Hence, the tolerance of the critical dimension on the chip can be affected and the resolution of the exposure can be reduced.

In a general photomask fabrication, the circuit layout pattern (the original mask layout pattern 100 in FIG. 1 ) of an integrated circuit is stored in magnetic tapes through a computer-aided design (CAD) system. Then, the designed circuit layout pattern is exposed to a glass plate or quartz plate coated photosensitive material. Next, the exposed photosensitive material is chemically developed and etched to form a mask with the circuit layout pattern. The conventional method of correcting the pattern on the corner region of the mask includes: using the software program within the mask writer to compute the size of the exposure compensating value when the mask writer is used to carry out the exposure. However, the exposure compensated mask pattern will still produce some corner rounding effect after the steps of chemical development and etching. In general, there are two major types of photo-exposure processes: one uses a laser beam while another uses an electron beam. In the laser beam exposure process, a laser beam is used to write out the pattern. One disadvantage of the laser beam method is the susceptibility of the pattern on the mask to the corner rounding effect as shown in the distorted pattern 102 in FIG. 1. The accuracy of the pattern and the process window are seriously affected especially when the dimension of the circuit design pattern is small.

In the electronic beam (e-beam) process, an electron beam is used to write out the pattern. The corner rounding effect on the pattern of the mask is less serious and the method has less effect on the process window of the photolithographic process. However, using an electronic beam to write out the pattern has a throughput significantly lower than using a laser beam. Furthermore, the cost of producing a mask using the electronic beam method is more than 5 times the cost of producing the same mask using the laser beam method.

In U.S. Pat. No. 6,792,592, a method for forming an accurate pattern on a photomask is disclosed. The method performs a selection of the appropriate writer properties and then uses the selected writer properties to choose the mask writer for the job. However, the method in the disclosure limits the formation of the pattern on the mask through the selected mask writer. Hence, the method can hardly solve the aforementioned problem.

SUMMARY OF THE INVENTION

Accordingly, at least one objective of the present invention is to provide a method of correcting a mask pattern and a correcting apparatus thereof that can avoid the corner-rounding problem and produce a highly accurate pattern on the mask. In addition, the reliability and throughput of the production is increased.

To achieve these and other advantages and in accordance with the purpose of the invention, as embodied and broadly described herein, the invention provides a method of correcting a mask pattern. First, an original writer drawing data of a circuit layout pattern is inputted. Then, a correcting writer rule that corresponds to the original writer drawing data is selected from a look-up table. Then, according to the correcting writer rule, the original writer drawing data is corrected to obtain a corrected writer drawing data of the circuit layout pattern.

According to one embodiment of the present invention, the correcting writer rule is obtained by forming a plurality of testing patterns on a test mask using the writer and performing an inspection to find the most appropriate circuit layout pattern among these test patterns.

According to one embodiment of the present invention, the writer is an electronic beam (e-beam) writer or a laser beam writer.

According to one embodiment of the present invention, the correcting writer rule determines the serif pattern dimension through the side length such as the length of the shorter side of the circuit layout pattern and the aspect ratio of the circuit layout pattern.

According to one embodiment of the present invention, when a correcting writer rule corresponding to the original writer drawing data is not found in the look-up table, a data refresh operation is carried out to input the new correcting writer rule that corresponds to the original writer drawing data in the look-up table. The aforementioned look-up table refreshing operation further includes performing a testing operation to obtain the correcting writer rule that corresponds to the original writer drawing data and storing the rule in the look-up table.

The present invention also provides a mask pattern correcting apparatus. The correcting apparatus comprises a memory unit, a receiver unit and a control unit. The memory unit has a look-up table. The look-up table further comprises a plurality of original writer drawing data and their corresponding correcting writer rules. The receiver unit receives an original writer drawing data of a circuit layout pattern. The control unit is connected to the receiver unit and the memory unit, and according to the original writer drawing data, a correcting writer rule that corresponds to the original writer drawing data is searched from the look-up table.

According to one embodiment of the present invention, the various correcting writer rules in the look-up table are obtained by forming a plurality of testing patterns on a test mask using the writer and performing an inspection to find the most appropriate circuit layout pattern among these test patterns.

According to one embodiment of the present invention, the aforementioned testing patterns are obtained by adding an auxiliary pattern to the corner regions of the circuit layout pattern. The auxiliary pattern comprises a plurality of serif patterns. For each serif pattern, the width $W_x$ in the X direction of each serif pattern is 0 to ½ of the length of the shorter side of the circuit layout pattern, the length $L_x$ in the X direction is 0 to ½ of the length of the shorter side of the circuit layout pattern, the width $W_y$ in the Y direction of each serif pattern is 0 to ½ of the length of the shorter side of the circuit layout pattern, and the length $L_y$ in the Y direction is 0 to ½ of the length of the shorter side of the circuit layout pattern.

According to one embodiment of the present invention, the aforementioned correcting apparatus further comprises a writer and a patterning device. The writer is connected to the control unit. According to the correcting writer rule found by the control unit, the corrected writer drawing data is written onto a photomask. The patterning device is connected to the writer for patterning the circuit layout pattern on the photomask.

In the present invention, a look-up table is built so that a corrective action can be implemented before forming a pattern on the mask. Hence, more accurate patterns are fabricated. In other words, the pattern is prevented from having corner rounding problem, thereby increasing the reliability and throughput of the fabrication process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
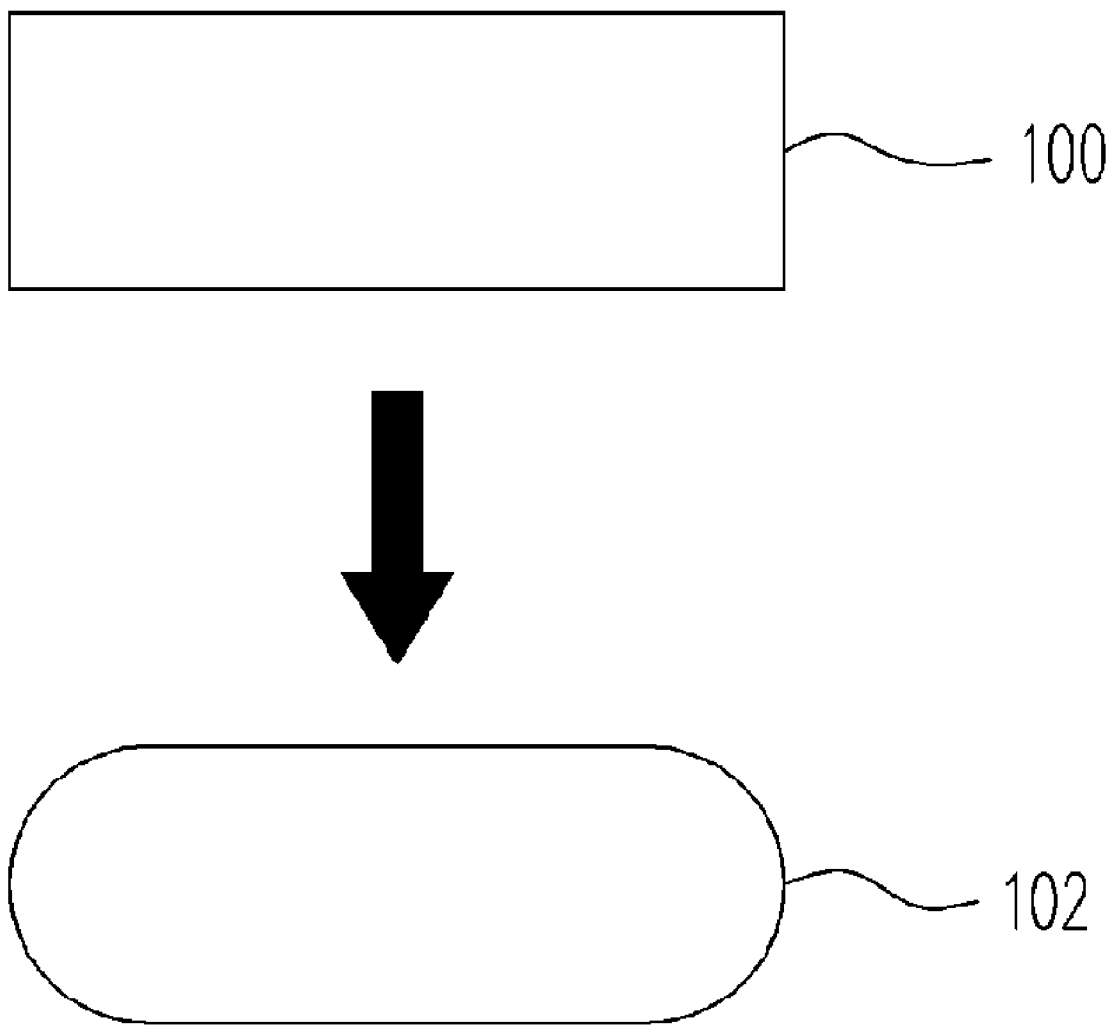
FIG. 1 is a diagram showing a conventional original mask layout pattern and its distorted pattern.

Reference will now be made in detail to the present preferred embodiments of the invention, examples of which are illustrated in the accompanying drawings. Wherever possible, the same reference numbers are used in the drawings and the description to refer to the same or like parts.

Due to dimensional deviation problem, and particularly, corner rounding problem, most mask patterning methods have undesirable consequences in subsequent fabricating processes such as a drop in the reliability and throughput and an increase in the production cost. Therefore, in the following embodiment, a mask pattern correcting apparatus and a correcting method thereof is provided.

Figure 2:
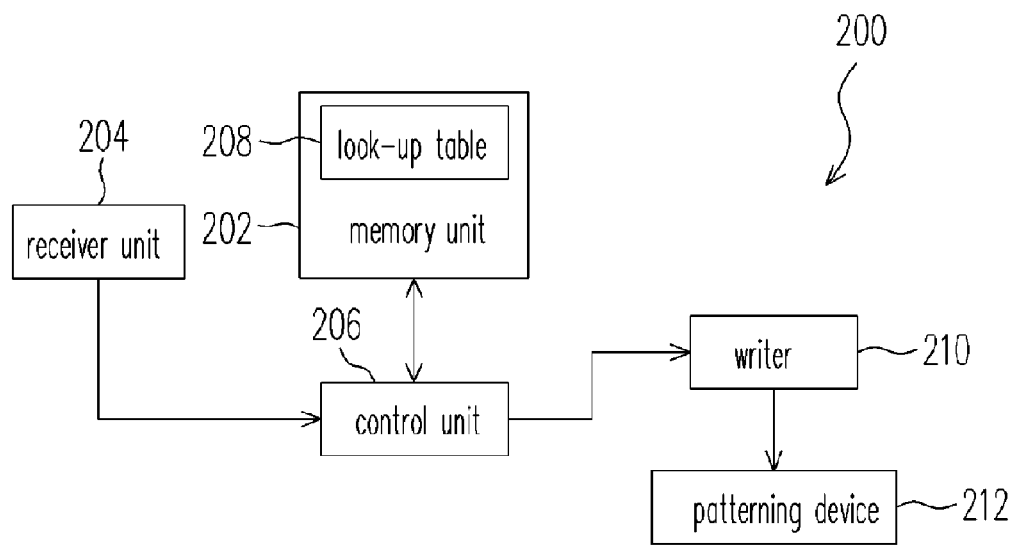
FIG. 2 is a block diagram showing a mask pattern correcting apparatus according to one embodiment of the present invention.

FIG. 2 is a block diagram showing a mask pattern correcting apparatus according to one embodiment of the present invention.

As shown in FIG. 2, the mask pattern correcting apparatus 200 of the present invention comprises a memory unit 202, a receiver unit 204 and a control unit 206. The memory unit 202 has a look-up table 208. The look-up table 208 comprises a plurality of original writer drawing data for fabricating circuit layout pattern on a mask and a set of correcting writer rules that correspond to the original writer drawing data. The receiver unit 204 receives the original writer drawing data of the circuit layout pattern. The control unit 206 is connected to the receiver unit 204 and the memory unit 202. According to the original writer drawing data picked up by the receiver 204, a correcting writer rule that corresponds to the original writer drawing data is searched from the look-up table 208. The correcting apparatus 200 further comprises a writer 210 and a patterning device 212. The writer 210 is connected to the control unit 206. According to the correcting writer rule found by the control unit 206, the corrected writer drawing data is written onto a mask. The patterning device 212 is connected to the writer 210. The patterning device 212 patterns the circuit layout pattern onto the mask so that a pattern is formed on the mask.

In one embodiment, the correcting writer rule in the look-up table 208 is obtained by forming a plurality of testing patterns in a testing mask and performing an inspection to find the most appropriate circuit layout pattern among the testing patterns. The aforementioned inspection is carried out using, for example, a scanning electron microscope (SEM) or an optical microscope (OM) and the testing pattern that matches the original design of the circuit layout pattern is picked up from the testing patterns. The writer drawing data of the testing pattern is the optimized and corrected writer drawing data that corresponds to the original design of the circuit layout pattern.

In one embodiment of the present invention, the aforementioned testing patterns are obtained by adding an auxiliary pattern to the corner regions of the circuit layout pattern. The auxiliary pattern comprises a plurality of serif patterns. In another embodiment of the present invention, the correcting writer rules determine the dimension of the serif patterns according to the side length such as the length of the shorter side of the original circuit layout pattern and the aspect ratio of the original circuit layout pattern. For each serif pattern, the width $W_x$ in the X direction of each serif pattern is 0 to ½ of the length of the shorter side of the circuit layout pattern, the length $L_x$ in the X direction is 0 to ½ of the length of the shorter side of the circuit layout pattern, the width $W_y$ in the Y direction of each serif pattern is 0 to ½ of the length of the shorter side of the circuit layout pattern, and the length $L_y$ in the Y direction is 0 to ½ of the length of the shorter side of the circuit layout pattern.

In the following, the method of finding the correcting writer rule of the circuit layout pattern is described.

Figure 3:
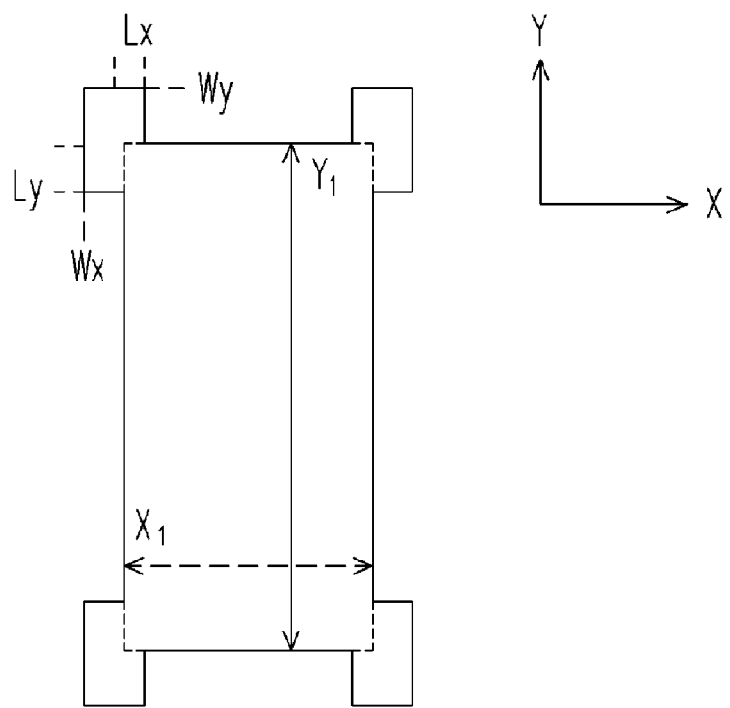
FIG. 3 is a circuit layout pattern corrected according to the present invention.

First, a plurality of testing patterns is formed on a testing mask through the writer. The testing patterns are obtained by adding auxiliary patterns on the originally designed circuit layout pattern. For example, if the circuit layout pattern has a rectangular shape with a shorter side having a length $X_1$ and a long side having a length $Y_1$, the testing pattern may add serif patterns to the four corners of the circuit layout pattern (as shown in FIG. 3). Here, the shorter side $X_1$ of the circuit layout pattern is between 160 nm to 4000 nm, the long side $Y_1$ of the circuit layout pattern is between 160 nm to 80000 nm and the aspect ratio $Y_1/X_1$ is between 1 to 20. For the serif pattern, the width $W_x$ is between 10 nm to $X_1/2$ nm, the width $W_y$ is between 10 nm to $X_1/2$ nm, the length $L_x$ is between 10 nm to $X_1/2$ nm and the length $L_y$ is between 10 nm and $X_1$ nm.

Then, the testing pattern on the mask is inspected using a scanning electron microscope or an optical microscope to find the testing pattern that matches the original design of the circuit layout pattern. The writer drawing data that matches the testing pattern found in the aforementioned process is the correcting writer rule of the originally designed circuit layout pattern. Because different writers may contribute to some degree of processing variation, the correcting writer rules for different writers may be slightly different.

TABLE 1

Look-up table for finding the correcting writer rule of a mask pattern according to one embodiment of the present invention

| Aspect Ratio ($Y_1/X_1$) of circuit layout pattern | Length (nm) of shorter side ($X_1$) of the circuit layout pattern | Dimension of auxiliary pattern ($W_x$, $W_y$, $L_x$ and $L_y$) (nm) |
| --- | --- | --- |
| $1 \leq Y_1/X_1 \leq 1.5$ | 280~600 | $W_x = W_y = L_x = L_y = 100$ |
|  | 601~1600 | $W_x = W_y = L_x = L_y = 130$ |
|  | >1601 | $W_x = W_y = L_x = L_y = 150$ |
| $1.5 \leq Y_1/X_1 \leq 4$ | 280~400 | $W_x = W_y = L_x = 100, L_y = 120$ |
|  | 401~800 | $W_x = W_y = 110, L_x = 130, L_y = 140$ |
|  | 801~1600 | $W_x = W_y = 120, L_x = 140, L_y = 170$ |
|  | >1601 | $W_x = W_y = 130, L_x = 160, L_y = 190$ |
| $Y_1/X_1 > 4$ | 280~400 | $W_x = W_y = 100, L_x = 110, L_y = 120$ |
|  | 401~800 | $W_x = W_y = 110, L_x = 130, L_y = 140$ |
|  | 801~1600 | $W_x = W_y = 120, L_x = 140, L_y = 170$ |
|  | >1601 | $W_x = W_y = 130, L_x = 160, L_y = 190$ |

For example, if the aspect ratio ($Y_1/X_1$) of the circuit layout pattern is between 1 to 1.5 and the length $X_1$ of the shorter side is between 280 nm to 600 nm, the correcting writer rule from the look-up table 1 is to add serif patterns to the circuit layout pattern. The required dimensions are $W_x=W_y=L_x=L_y=100$ nm. In this way, the subsequently formed pattern on the mask will not have corner rounding problem.

Figure 4:
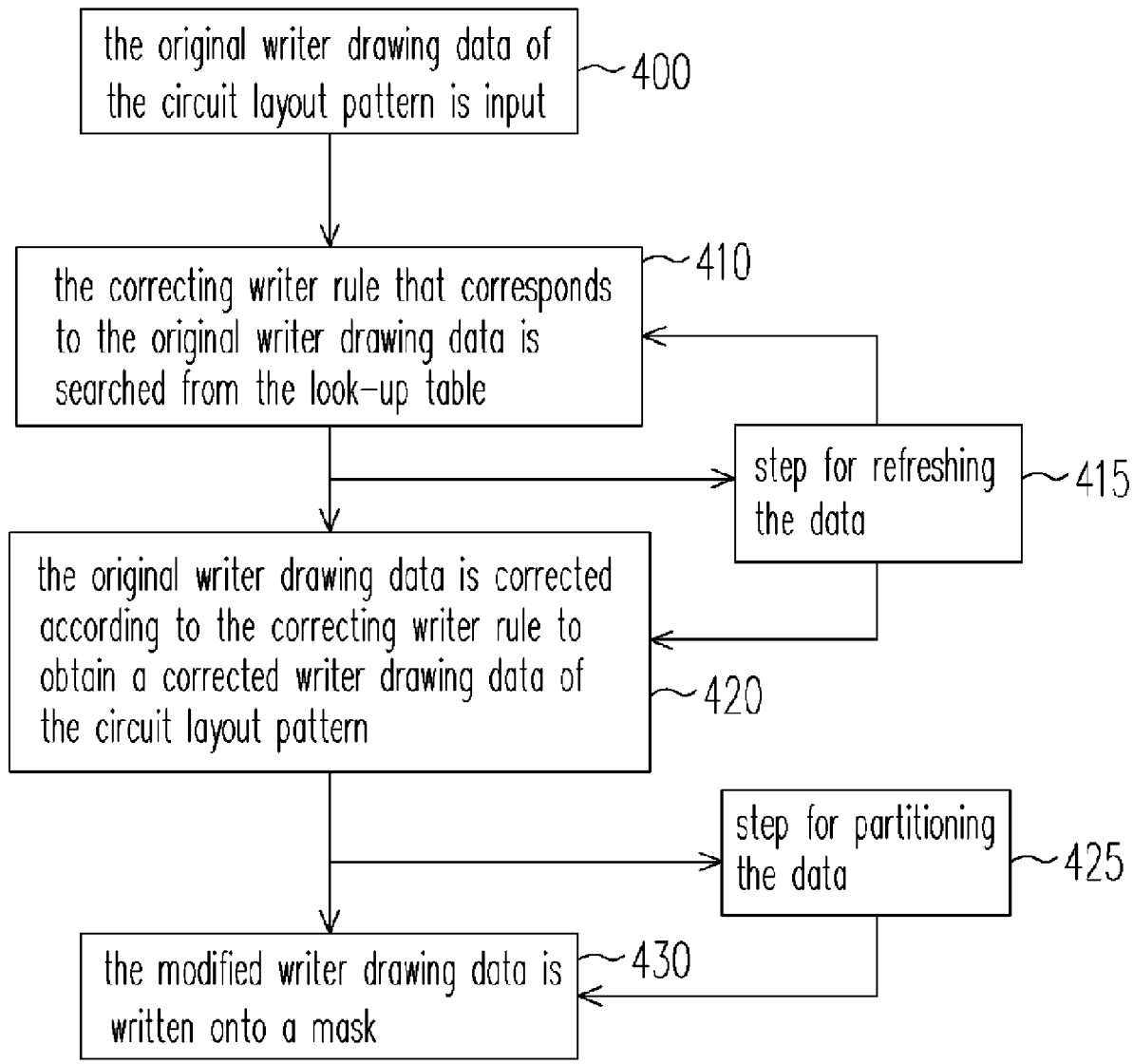
FIG. 4 is a flow chart showing the steps for correcting the mask pattern according to the embodiment of the present invention.

In the following, the method of using the aforementioned mask pattern correcting apparatus to correct the mask pattern is described. FIG. 4 is a flow chart showing the steps for correcting the mask pattern according to the embodiment of the present invention.

Figure 5:
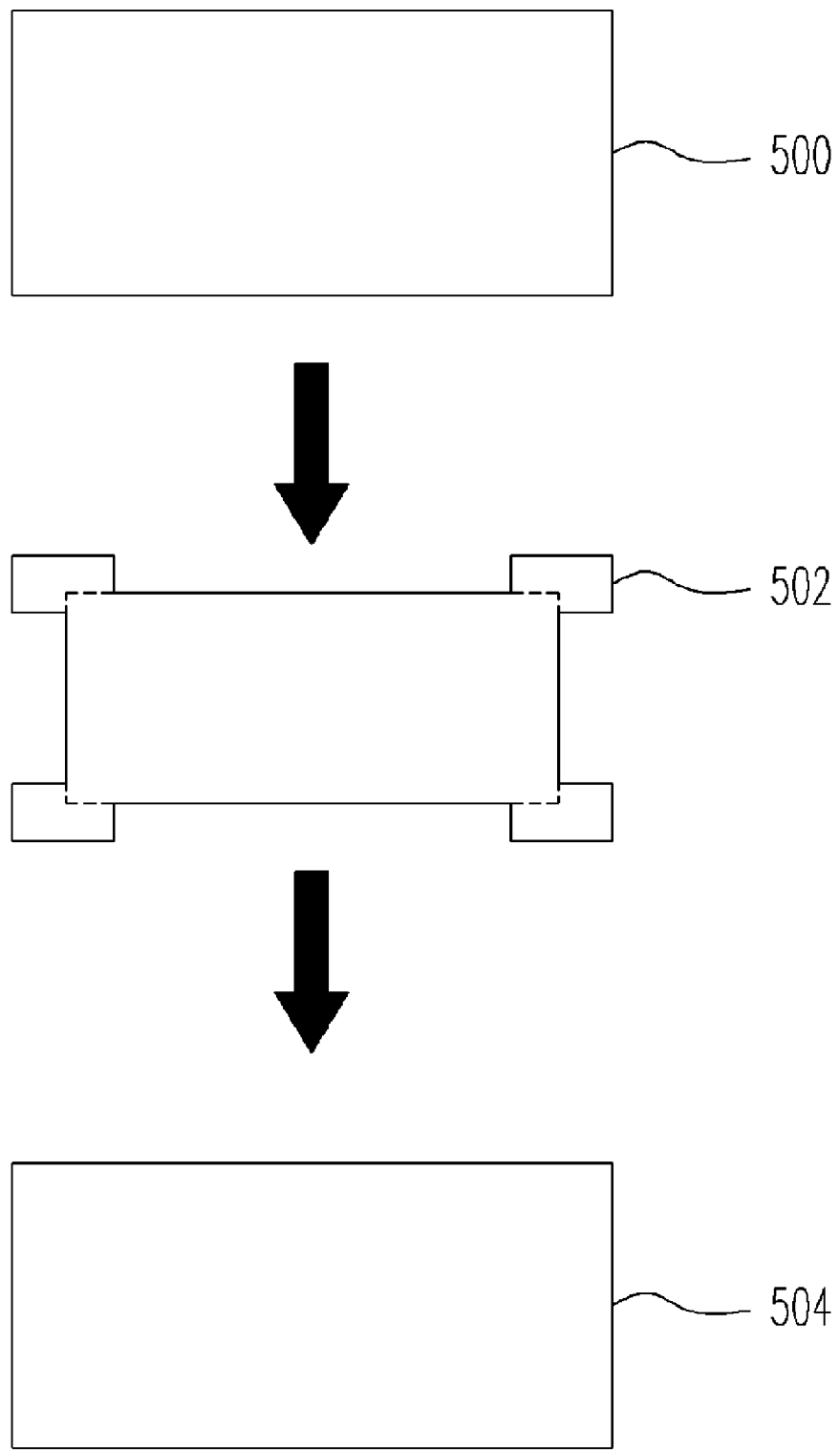
FIG. 5 is a diagram showing the original mask layout pattern, the corrected mask layout pattern and the mask pattern according to the method of the present invention.

As shown in FIGS. 2 and 4, the original writer drawing data of the circuit layout pattern (the original mask layout pattern 500 in FIG. 5) is input in step 400. For example, the original writer drawing data of the originally designed circuit layout pattern is input to the receiver unit 204 of the correcting apparatus 200.

In step 410, the correcting writer rule that corresponds to the original writer drawing data is searched from the look-up table 208. For example, the original writer drawing data picked up by the receiver unit 204 is transmitted to the control unit 206. According to the original writer drawing data, a search is carried out in the memory unit 202. In other words, according to the original writer drawing data, the look-up table 208 inside the memory unit 202 is searched to find a correcting writer rule that corresponds to the original writer drawing data.

In the aforementioned step 410, if a correcting writer rule that corresponds to the original writer drawing data is not found in the look-up table 208, a data refresh operation is carried out on the look-up table 208 in step 415. Thus, a correcting writer rule that corresponds to the original writer drawing data is added to the look-up table 208. The aforementioned step for refreshing the data in the look-up table 208 is to carry out a testing operation and obtain the correcting writer rule that corresponds to the original writer drawing data and then store the correcting writer rule in the look-up table 208. Similarly, the testing operation for refreshing the data in the look-up table 208 includes forming a plurality of testing patterns on a testing mask through the writer and performing an inspection to find an appropriate circuit layout pattern among the testing patterns.

In step 420, the original writer drawing data is corrected according to the correcting writer rule to obtain a corrected writer drawing data (such as the corrected mask layout pattern 502 in FIG. 5) of the circuit layout pattern.

In addition, before writing the modified writer drawing data to the mask, a partitioning of the corrected writer drawing data can be carried out in step 425. For example, the modified writer drawing data ready for forming a mask is cut into smaller stripes and then the step for writing out the pattern is carried out.

In step 430, the modified writer drawing data is written onto a mask. This step is an additional writing step for writing the modified writer drawing data to a mask so that a pattern is formed on the mask (the mask pattern 504 shown in FIG. 5). In the aforementioned writing step, an electron beam (e-beam) or a laser beam can be used.

In summary, the major advantages of the present invention at least include: 1. Through the construction of a look-up table for performing a correcting operation prior to forming a pattern on the mask, more accurate mask pattern is produced. In other words, corner rounding is no longer a problem so that the reliability and the yield of the fabrication are improved. 2. The pattern can be written either by an electron beam or a laser beam, which means that the present invention does not limit the pattern writing method. Consequently, the throughput can be increased and the production cost can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for correcting a mask pattern, comprising the steps of:
   inputting an original writer drawing data of a circuit layout pattern;
   searching out a correcting writer rule that corresponds to the original writer drawing data from a look-up table wherein; and
   correcting the writer drawing data according to the correcting writer rule to obtain a corrected writer drawing data of the circuit layout pattern,
   wherein the correcting writer rule is obtained by forming a plurality of testing patterns on a testing mask through a writer and performing in inspection to find a testing pattern that matches the circuit layout pattern, the correcting writer rule includes adding a serif pattern to the corner of the circuit layout pattern and determines the dimension of the serif pattern by the length of the shorter side of the circuit layout pattern and the aspect ratio of the circuit layout pattern.

2. The method for correcting a mask pattern of claim 1, wherein the writer can be an electron beam (e-beam) writer or a laser beam writer.

3. The method for correcting a mask pattern of claim 1, wherein the look-up table undergoes a data refresh operation to add the correcting writer rule if the correcting writer rule is not found in the look-up table.

4. The method for correcting a mask pattern of claim 3, wherein the data refreshing operation further includes performing a testing operation to obtain the correcting writer rule that corresponds to the original writer drawing data and store to the look-up table.

* * * * *